(12) United States Patent
Oya

(10) Patent No.: US 11,887,904 B2
(45) Date of Patent: Jan. 30, 2024

(54) INTEGRALLY BONDED SEMICONDUCTOR DEVICE AND POWER CONVERTER INCLUDING THE SAME

(71) Applicant: Mitsubishi Electric Corporation, Tokyo (JP)

(72) Inventor: Daisuke Oya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 168 days.

(21) Appl. No.: 17/602,634

(22) PCT Filed: Jul. 11, 2019

(86) PCT No.: PCT/JP2019/027577
§ 371 (c)(1),
(2) Date: Oct. 8, 2021

(87) PCT Pub. No.: WO2021/005797
PCT Pub. Date: Jan. 14, 2021

(65) Prior Publication Data
US 2022/0165631 A1 May 26, 2022

(51) Int. Cl.
*H01L 23/10* (2006.01)
*H01L 23/049* (2006.01)
(Continued)

(52) U.S. Cl.
CPC ............ *H01L 23/10* (2013.01); *H01L 23/049* (2013.01); *H01L 23/3735* (2013.01);
(Continued)

(58) Field of Classification Search
CPC ... H01L 23/10; H01L 23/049; H01L 23/3735; H01L 24/32; H01L 24/48; H01L 24/73;
(Continued)

(56) References Cited

U.S. PATENT DOCUMENTS

2019/0304866 A1* 10/2019 Kitabayashi .......... H01L 23/057
2020/0185295 A1* 6/2020 Ishibashi ........... H02M 7/53871

FOREIGN PATENT DOCUMENTS

JP 2000-091472 A 3/2000
JP 2000-133769 A 5/2000

OTHER PUBLICATIONS

International Search Report issued in PCT/JP2019/027577; dated Sep. 24, 2019.

* cited by examiner

*Primary Examiner* — Patricia D Valenzuela
(74) *Attorney, Agent, or Firm* — Studebaker & Brackett PC

(57) ABSTRACT

It is an object to provide technology allowing for improvement in productivity of a semiconductor device. A semiconductor device includes: a base plate; an insulating substrate including a ceramic plate integrally bonded to an upper surface of the base plate with no solder layer therebetween and a circuit pattern disposed on an upper surface of the ceramic plate; a semiconductor element mounted on an upper surface of the circuit pattern; a case surrounding the insulating substrate and the semiconductor element over the base plate; an adhesive to adhere a lower portion of the case to an outer peripheral portion of the ceramic plate; and a sealant to seal the interior of the case, wherein the adhesive is in contact with an outer peripheral end of the ceramic plate to an outer peripheral end of the circuit pattern.

7 Claims, 3 Drawing Sheets

(51) Int. Cl.
 *H01L 23/373* (2006.01)
 *H02P 27/06* (2006.01)
 *H01L 23/00* (2006.01)
 *H01L 23/24* (2006.01)

(52) U.S. Cl.
 CPC .............. *H01L 23/24* (2013.01); *H01L 24/73* (2013.01); *H02P 27/06* (2013.01)

(58) Field of Classification Search
 CPC . H01L 2224/32225; H01L 2224/48091; H01L 2224/48227; H01L 2224/73265; H01L 2924/181; H01L 2924/3512; H01L 23/053; H01L 23/24; H01L 23/15; H01L 23/36; H01L 23/49811; H02P 27/06
 See application file for complete search history.

F I G. 5
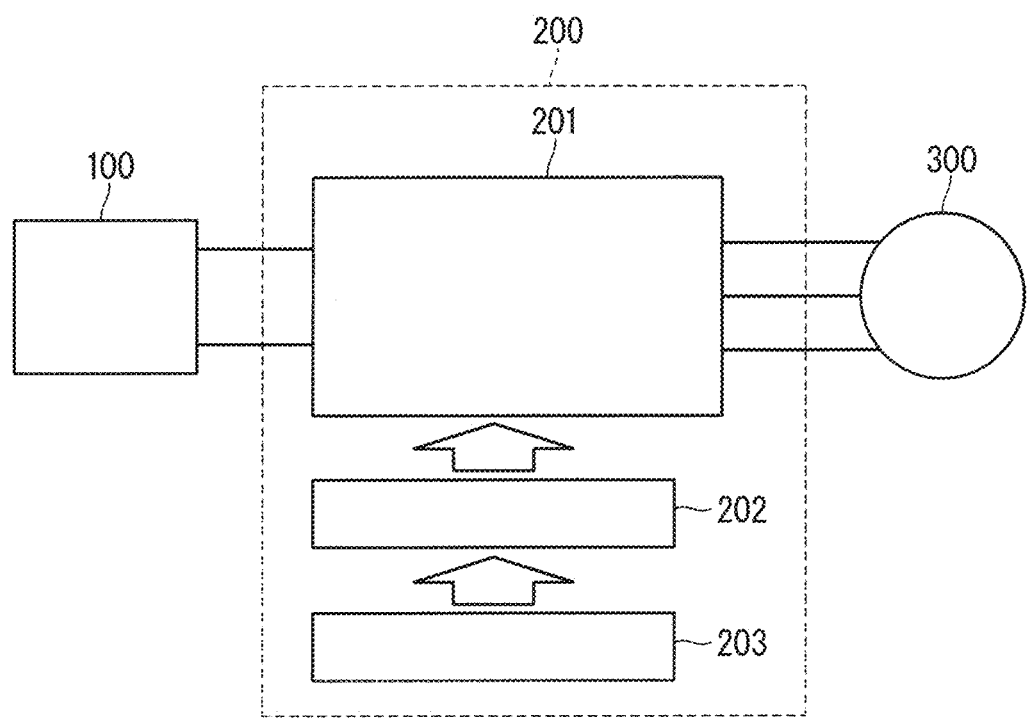

INTEGRALLY BONDED SEMICONDUCTOR DEVICE AND POWER CONVERTER INCLUDING THE SAME

TECHNICAL FIELD

The present invention relates to semiconductor devices used for control of motors of railroad equipment and automotive equipment, for example.

BACKGROUND ART

Conventionally, a semiconductor element is bonded to an insulating substrate by a solder, Ag, and the like, and the insulating substrate is bonded to a base plate for heat dissipation by a solder and the like. The insulating substrate includes a ceramic plate formed of AlN, $Al_2O_3$, or SiN and metal, such as Al and Cu, bonded to opposite surfaces of the ceramic plate, and the metal bonded to the surfaces is a circuit pattern.

In addition to the semiconductor element, an electrode to externally output a current is bonded to the circuit pattern by soldering, ultrasonic bonding, and the like. A semiconductor chip and the electrode are connected by a wire. A case formed of a poly phenylene sulfide resin (PPS) or polybutyleneterephtalate (PBT) is bonded to the base plate by an adhesive to cover the insulating substrate and the semiconductor element. A sealant, such as a silicone gel and an epoxy-based resin, is injected into the case to secure insulation and prevent contamination. A silicone-based or polyimide-based insulating coating is applied to cover an outer peripheral end of the circuit pattern of the insulating substrate to further improve insulation in the case.

For example, Patent Document 1 discloses a semiconductor device in which a base plate and an insulating substrate are integrated with each other by direct bonding, a case is bonded to the base plate by an adhesive, and an insulating coating is applied to cover an outer peripheral end of a circuit pattern.

Patent Document 2 discloses a semiconductor device in which a base plate and an insulating substrate are bonded together by a solder, and a case is bonded to a ceramic plate of the insulating substrate by an adhesive.

PRIOR ART DOCUMENTS

Patent Documents

Patent Document 1: Japanese Patent Application Laid-Open No. 2000-91472
Patent Document 2: Japanese Patent Application Laid-Open No. 2000-133769

SUMMARY

Problem to be Solved by the Invention

Technology disclosed in Patent Document 1, however, requires a step of applying the adhesive to adhere the case and a step of applying the insulating coating to improve insulation, and has a problem in that it is difficult to improve productivity of the semiconductor device.

Patent Document 2 is silent on application of the insulating coating, but requires the step of applying the insulating coating to improve insulation in the case, and has a similar problem to Patent Document 1.

The step of applying the adhesive or the insulating coating is herein a series of steps including a step of applying the adhesive or the insulating coating to a base plate or a ceramic plate using a dispenser, a decompression step of performing degassing, and a heat treatment step of curing the adhesive or the insulating coating.

It is thus an object of the present invention to provide technology allowing for improvement in productivity of a semiconductor device.

Means to Solve the Problem

A semiconductor device according to the present invention includes: a base plate; an insulating substrate including a ceramic plate integrally bonded to an upper surface of the base plate with no solder layer therebetween and a circuit pattern disposed on an upper surface of the ceramic plate; a semiconductor element mounted on an upper surface of the circuit pattern; a case surrounding the insulating substrate and the semiconductor element over the base plate; an adhesive to adhere a lower portion of the case to an outer peripheral portion of the ceramic plate; and a sealant to seal an interior of the case, wherein the adhesive is in contact with an outer peripheral end of the ceramic plate to an outer peripheral end of the circuit pattern.

Effects of the Invention

According to the present invention, the adhesive is in contact with the outer peripheral end of the ceramic plate to the outer peripheral end of the circuit pattern, and thus can perform a function of adhering the lower portion of the case to the outer peripheral portion of the ceramic plate and a function of insulatively coating the outer peripheral end of the circuit pattern. This eliminates the need for a step of applying the insulating coating, and thus productivity of the semiconductor device can be improved.

The objects, features, aspects, and advantages of the present invention will become more apparent from the following detailed description and the accompanying drawings.

BRIEF DESCRIPTION OF DRAWINGS

FIG. 5 is a block diagram showing a configuration of a power conversion system to which a power converter according to Embodiment 2 has been applied.

DESCRIPTION OF EMBODIMENTS

Embodiment 1

Figure 1:
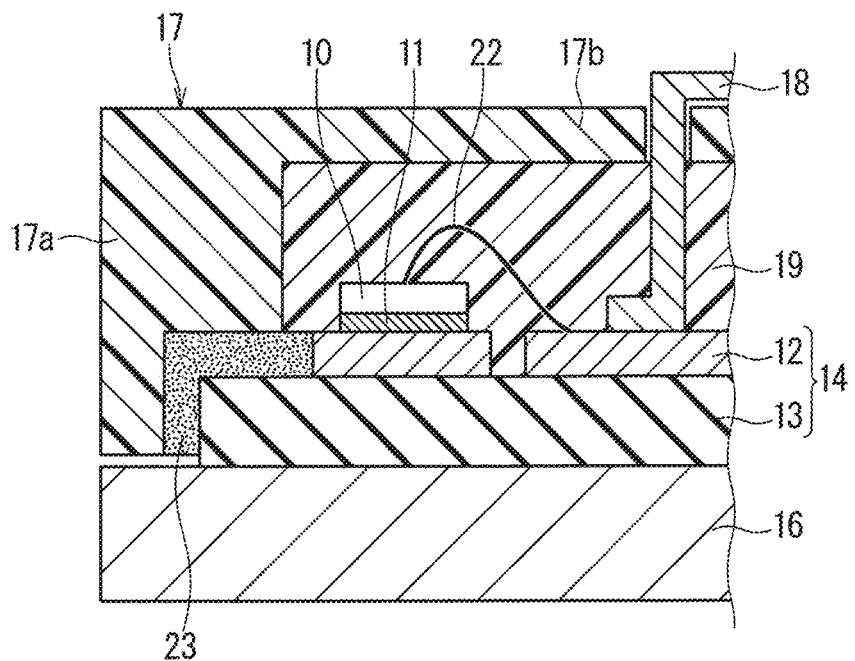
FIG. 1 is a cross-sectional view of a semiconductor device according to Embodiment 1.

Embodiment 1 of the present invention will be described below with reference to the drawings. FIG. 1 is a cross-sectional view of a semiconductor device 202 according to Embodiment 1.

As illustrated in FIG. 1, the semiconductor device 202 includes a base plate 16, an insulating substrate 14, a semiconductor element 10, a case 17, an adhesive 23, and a sealant 19.

The base plate 16 is formed to be rectangular in plan view using metal, such as copper, to secure heat dissipation.

The insulating substrate 14 includes a ceramic plate 13 and a circuit pattern 12. The ceramic plate 13 is formed to be rectangular in plan view using AlN, $Al_2O_3$, or SiN.

An outline in plan view of the ceramic plate 13 is smaller than that of the base plate 16, and the ceramic plate 13 is integrally bonded to a portion of an upper surface of the base plate 16 except for a peripheral edge portion thereof with no solder layer therebetween. Specifically, the base plate 16 and the ceramic plate 13 are bonded together without a solder by direct bonding, braze bonding using a braze and the like, or diffusion bonding using metal.

The circuit pattern 12 is formed using Al or Cu. The circuit pattern 12 is divided into at least two portions, and the portions are arranged to be spaced apart from one another on a portion of an upper surface of the ceramic plate 13 except for a peripheral edge potion thereof. The semiconductor element 10 includes a wide bandgap semiconductor, and is mounted on an upper surface of one of the divided portions of the circuit pattern 12. An electrode 18 to externally output a current is connected to an upper surface of another one of the divided portions of the circuit pattern 12.

The case 17 is formed using a PPS or PBT, and includes a side portion 17a in the form of a rectangular frame in plan view and a top portion 17b. The side portion 17a surrounds the insulating substrate 14 and the semiconductor element 10 over the base plate 16. A lower portion of the side portion 17a and an outer peripheral portion of the ceramic plate 13 are adhered to each other by the adhesive 23. The top portion 17b forms a top surface of the semiconductor device 202, and one end portion of the electrode 18 externally protrudes from a hole formed in the top portion 17b.

The sealant 19 is a silicone gel or an epoxy-based resin, and seals the interior of the case 17.

The adhesive 23 is applied to the entire outer peripheral end of the ceramic plate 13 to the entire outer peripheral end of the circuit pattern 12. The adhesive 23 is in contact with the outer peripheral end of the ceramic plate 13 to the outer peripheral end of the circuit pattern 12, and is required to have not only a function of adhering a lower portion of the case 17 to the outer peripheral portion of the ceramic plate 13 but also a function of insulatively coating the outer peripheral end of the circuit pattern 12. The adhesive 23 thus has a greater breakdown voltage than the sealant 19. Specifically, the adhesive 23 preferably has a breakdown voltage of 15 kV/mm or more. Furthermore, the adhesive 23 preferably has a viscosity of 2.0 P·s or more to suppress dripping of the adhesive 23. The adhesive 23 is preferably a silicone-based adhesive and more preferably a thermosetting silicone-based adhesive.

As described above, the semiconductor device 202 according to Embodiment 1 includes: the base plate 16; the insulating substrate 14 including the ceramic plate 13 integrally bonded to the upper surface of the base plate 16 with no solder layer therebetween and the circuit pattern 12 disposed on the upper surface of the ceramic plate 13; the semiconductor element 10 mounted on the upper surface of the circuit pattern 12; the case 17 surrounding the insulating substrate 14 and the semiconductor element 10 over the base plate 16; the adhesive 23 to adhere the lower portion of the case 17 to the outer peripheral portion of the ceramic plate 13; mid the sealant 19 to seal the interior of the case 17, wherein the adhesive 23 is in contact with the outer peripheral end of the ceramic plate 13 to the outer peripheral end of the circuit pattern 12.

The adhesive 23 is in contact with the outer peripheral end of the ceramic plate 13 to the outer peripheral end of the circuit pattern 12, and can perform the function of adhering the lower portion of the case 17 to the outer peripheral portion of the ceramic plate 13 and the function of insulatively coating the outer peripheral end of the circuit pattern 12. This eliminates the need for a step of applying an insulating coating, and thus productivity of the semiconductor device 202 can be improved.

The adhesive 23 is not applied to the base plate 16, so that the base plate 16 is not required to have a region to which the adhesive 23 is applied, and thus the base plate 16 and further the semiconductor device 202 can be reduced in size.

In a case where the ceramic plate 13 is bonded to the base plate 16 by a solder, cracking of the ceramic plate 13 can occur because the ceramic plate 13 takes up stress at bolting when the semiconductor device is attached to a cooler with a bolt. In Embodiment 1, however, the ceramic plate 13 is integrally bonded to the upper surface of the base plate 16 with no solder layer therebetween, and thus the base plate 16 and the ceramic plate 13 can take up stress at bolting. The likelihood of the occurrence of cracking of the ceramic plate 13 is thereby reduced.

The semiconductor element 10 includes the wide bandgap semiconductor, and thus high-temperature operation and high-speed operation of the semiconductor device 202 can be achieved. Furthermore, the cooler and a control circuit to be connected to the semiconductor device 202 can also be reduced in size.

Reduction in size of the semiconductor device compatible with the performance of the wide bandgap semiconductor has been difficult due to constraints on a package side, such as an insulating distance and internal wiring, but the present embodiment allows for reduction in size on the package side, and allows for reduction in size utilizing the performance of the wide bandgap semiconductor.

The lower portion of the case 17 is adhered to the outer peripheral portion of the ceramic plate 13, and thus the case 17 can suppress dripping of the adhesive 23. A film thickness of the adhesive 23 functioning as a coating and being in contact with the outer peripheral end of the circuit pattern 12 is thereby stabilized, so that reliability of insulation in the case 17 is improved.

The adhesive 23 has a greater breakdown voltage than the sealant 19, so that insulation in the case 17 is improved.

Other Modifications

Figure 2:
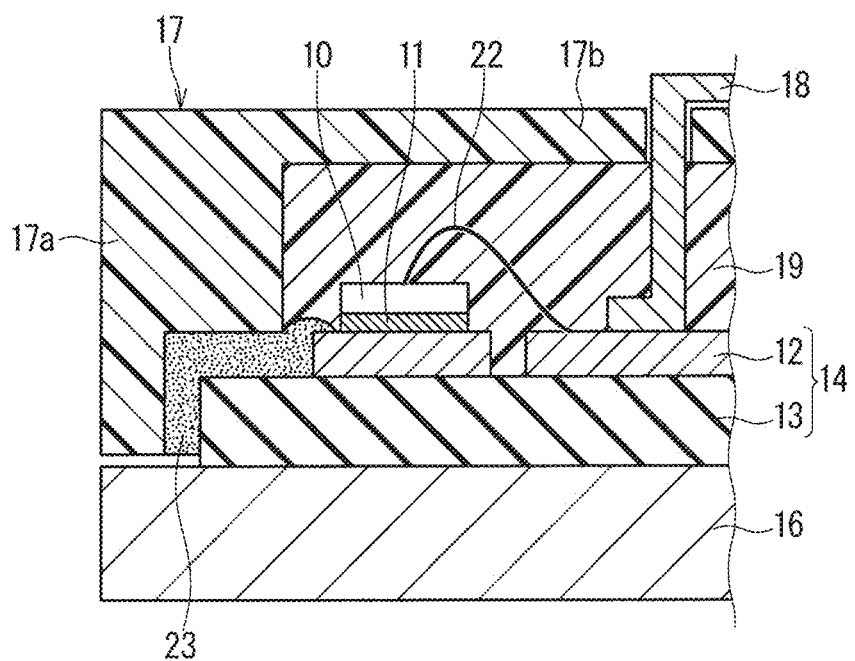
FIG. 2 is a cross-sectional view of a semiconductor device according to Modification I of Embodiment 1.
Figure 3:
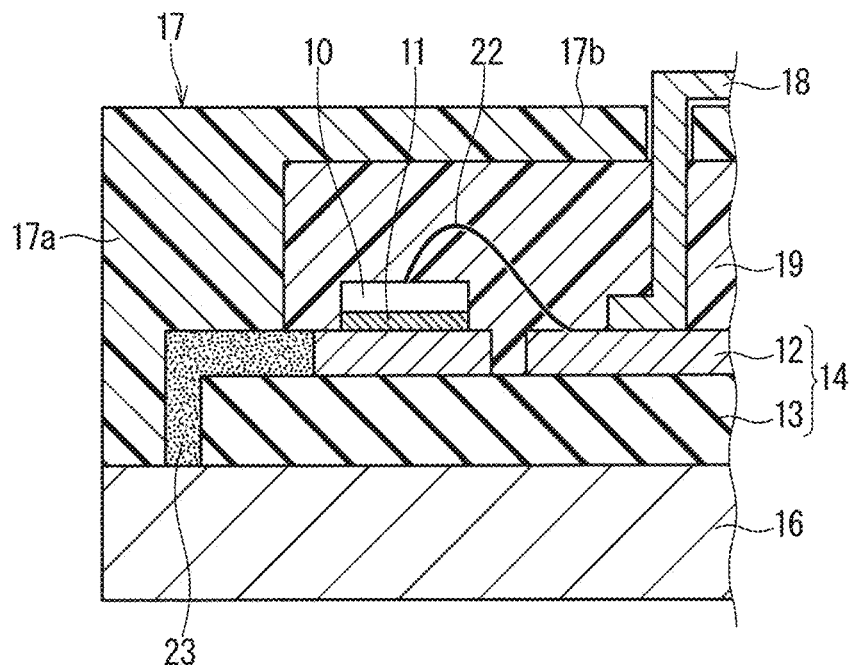
FIG. 3 is a cross-sectional view of a semiconductor device according to Modification 2 of Embodiment 1.
Figure 4:
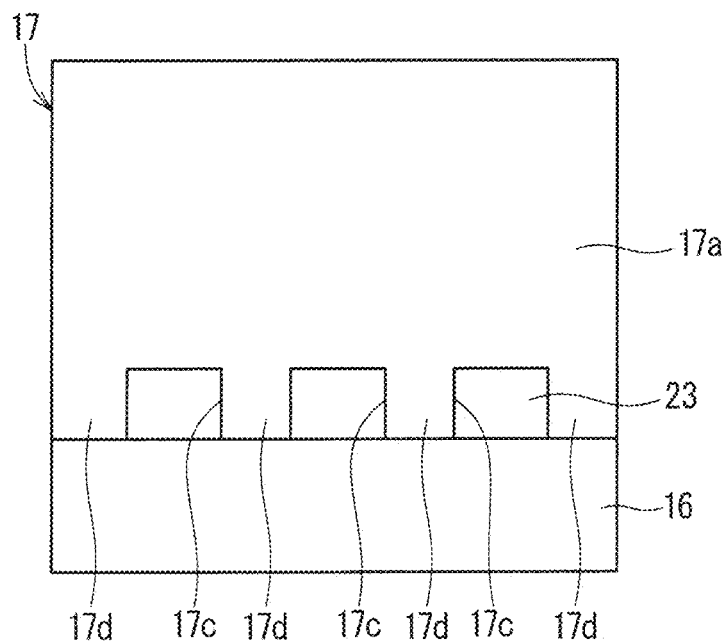
FIG. 4 is a side view of a semiconductor device according to Modification 3 of Embodiment 1.

Modifications of Embodiment 1 will be described next. FIG. 2 is a cross-sectional view of a semiconductor device 202A according to Modification 1 of Embodiment 1. FIG. 3 is a cross-sectional view of a semiconductor device 202B according to Modification 2 of Embodiment 1. FIG. 4 is a side view of a semiconductor device 202C according to Modification 3 of Embodiment 1.

As illustrated in FIG. 2, the case 17 may not only suppress dripping of the adhesive 23 but also squash the adhesive 23 so that the adhesive 23 rides on the peripheral edge portion of the upper surface of the circuit pattern 12. A riding portion of the adhesive 23 is formed over the entire peripheral edge portion of the upper surface of the circuit pattern 12. The adhesive 23 is further in contact with the peripheral edge portion of the upper surface of the circuit pattern 12, so that insulation in the case 17 is further improved by suppressing discharge occurring at an edge of the upper surface of the circuit pattern 12.

As illustrated in FIG. 3, a lower end of the side portion 17a of the case 17 may be in contact with the upper surface of the base plate 16. Direct contact of the side portion 17a of the case 17 with the upper surface of the ceramic plate 13 is thereby suppressed, and stress applied to the ceramic plate 13 can be relieved. The likelihood of breakage of the ceramic plate 13 can be reduced, and thus reliability of a product can be improved.

As illustrated in FIG. 4, the lower end of the side portion 17a of the case 17 may be in partial contact with the upper surface of the base plate 16. Specifically, the lower end of the side portion 17a has been roughened to have consecutive recesses 17c and protrusions 17d, and the adhesive 23 has entered into the recesses 17c. The adhesive 23 is thus more likely to be exposed to air, and curing of the adhesive 23 is accelerated, so that the effects of improving productivity while securing reliability of the product can be obtained in addition to the effects obtained in a case of the semiconductor device 202B illustrated in FIG. 3.

Embodiment 2

In the present embodiment, the semiconductor device 202 according to Embodiment 1 described above is applied to a power converter. The semiconductor device 202 according to Embodiment 1 is not limited to a particular power converter, but a case where the semiconductor device 202 according to Embodiment 1 is applied to a three-phase inverter will be described below in Embodiment 2.

FIG. 5 is a block diagram showing a configuration of a power conversion system to which the power converter according to Embodiment 2 has been applied.

The power conversion system shown in FIG. 5 includes a power supply 100, a power converter 200, and a load 300. The power supply 100 is a DC power supply, and supplies DC power to the power converter 200. The power supply 100 can be configured in various forms, and, for example, can be configured by a DC system, a solar cell, or a storage battery, and may be configured by a rectifier circuit or an AC/DC converter connected to an AC system. The power supply 100 may be configured by a DC/DC converter to convert DC power output from the DC system into predetermined power.

The power converter 200 is a three-phase inverter connected between the power supply 100 and the load 300, and converts the DC power supplied from the power supply 100 into AC power, and supplies the AC power to the load 300. As shown in FIG. 5, the power converter 200 includes a main conversion circuit 201 to convert the DC power into the AC power for output and a control circuit 203 to output, to the main conversion circuit 201, a control signal to control the main conversion circuit 201.

The load 300 is a three-phase motor driven by the AC power supplied from the power converter 200. The load 300 is not limited to that for a particular application, is a motor mounted to various types of electrical equipment, and is used as a motor for hybrid vehicles, electric vehicles, railroad vehicles, elevators, and air-conditioning equipment, for example.

The power converter 200 will be described in detail below. The main conversion circuit 201 includes switching elements and freewheeling diodes (not illustrated), and converts the DC power supplied from the power supply 100 into the AC power, and supplies the AC power to the load 300 through switching of the switching elements. The main conversion circuit 201 can have various specific circuit configurations, and the main conversion circuit 201 according to the present embodiment is a two-level three-phase full-bridge circuit, and can include six switching elements and six freewheeling diodes connected in anti-parallel with the respective switching elements. The switching elements and the freewheeling diodes of the main conversion circuit 201 are each configured by the semiconductor device corresponding to that in any of Embodiment 1 and Modifications 1 to 3 of Embodiment 1 described above. A case where the switching elements and the freewheeling diodes are each configured by the semiconductor device 202 according to Embodiment 1 will be described herein. Every two switching elements out of the six switching elements are connected in series with each other to constitute pairs of upper and lower arms, and the pairs of upper and lower arms constitute respective phases (a U phase, a V phase, and a W phase) of the full-bridge circuit. Output terminals of the respective pairs of upper and lower arms, that is, three output terminals of the main conversion circuit 201 are connected to the load 300.

The main conversion circuit 201 includes a drive circuit (not illustrated) to drive each of the switching elements, and the drive circuit may be incorporated in the semiconductor device 202, or may be provided separately from the semiconductor device 202. The drive circuit generates a drive signal to drive each of the switching elements of the main conversion circuit 201, and supplies the drive signal to a control electrode of each of the switching elements of the main conversion circuit 201. Specifically, the drive circuit outputs, to the control electrode of each of the switching elements, a drive signal to switch the switching element to an on state and a drive signal to switch the switching element to an off state in accordance with the control signal from the control circuit 203, which will be described below. The drive signal is a voltage signal (an on signal) equal to or greater than a threshold voltage of the switching element when the switching element is maintained in the on state, and is a voltage signal (an off signal) equal to or smaller than the threshold voltage of the switching element when the switching element is maintained in the off state.

The control circuit 203 controls the switching elements of the main conversion circuit 201 so that desired power is supplied to the load 300. Specifically, time (on time) during which each of the switching elements of the main conversion circuit 201 is to be in the on state is calculated based on power to be supplied to the load 300. For example, the main conversion circuit 201 can be controlled through PWM control to modulate the on time of each of the switching elements in accordance with a voltage to be output. A control command (the control signal) is output to the drive circuit of the main conversion circuit 201 so that the on signal is output to a switching element to be in the on state, and the off signal is output to a switching element to be in the off state at each time point. The drive circuit outputs, as the drive signal, the on signal or the off signal to the control electrode of each of the switching elements in accordance with the control signal.

In the power converter according to the present embodiment, the semiconductor device 202 according to Embodiment 1 is applied as each of the switching elements and the freewheeling diodes of the main conversion circuit 201, and thus reliability can be improved.

An example in which the semiconductor device 202 according to Embodiment 1 is applied to the two-level three-phase inverter has been described in the present embodiment, but the semiconductor device 202 according to Embodiment 1 is not limited to this example, and is applicable to various power converters. Although the power converter in the present embodiment is a two-level power converter, the power converter may be a three-level or multi-level power converter, and the semiconductor device 202 according to Embodiment 1 may be applied to a single-phase inverter when power is supplied to a single-phase load. The semiconductor device 202 according to Embodiment 1 is applicable to a DC/DC converter or an AC/DC converter when power is supplied to a DC load and the like.

The power converter to which the semiconductor device 202 according to Embodiment 1 has been applied is not limited to that in the above-mentioned case where the load is the motor, and can be used as a power supply device of an electrical discharge machine, a laser machine, an induction cooker, and a noncontact power supply system, for example, and can further be used as a power conditioner of a photovoltaic system, a storage system, and the like.

While the invention has been described in detail, the foregoing description is in all aspects illustrative and not restrictive. It is therefore understood that numerous unillustrated modifications can be devised without departing from the scope of the invention.

Embodiments of the present invention can freely be combined with each other, and can be modified or omitted as appropriate within the scope of the invention.

Explanation of Reference Signs

10 semiconductor element, 12 circuit pattern, 13 ceramic plate, 14 insulating substrate, 16 base plate, 17 case, 19 sealant, 23 adhesive, 200 power converter, 201 main conversion circuit, 202, 202A, 202B, 202C semiconductor device, 203 control circuit.

The invention claimed is:

1. A semiconductor device comprising:
    a base plate;
    an insulating substrate including a ceramic plate and a circuit pattern, the ceramic plate being integrally bonded to an upper surface of the base plate with no solder layer therebetween, the circuit pattern being disposed on an upper surface of the ceramic plate;
    a semiconductor element mounted on an upper surface of the circuit pattern;
    a case surrounding the insulating substrate and the semiconductor element over the base plate;
    an adhesive to adhere a lower portion of the case to an outer peripheral portion of the ceramic plate; and
    a sealant to seal an interior of the case, wherein
    the adhesive is in contact with an outer peripheral end of the ceramic plate to an outer peripheral end of the circuit pattern.

2. The semiconductor device according to claim 1, wherein
    the adhesive has a greater breakdown voltage than the sealant.

3. The semiconductor device according to claim 1, wherein
    the adhesive is further in contact with a peripheral edge portion of the upper surface of the circuit pattern.

4. The semiconductor device according to claim 1, wherein
    a lower end of the case is in contact with the upper surface of the base plate.

5. The semiconductor device according to claim 4, wherein
    the lower end of the case is in partial contact with the upper surface of the base plate.

6. The semiconductor device according to claim 1, wherein
    the semiconductor element comprises a wide bandgap semiconductor.

7. A power converter comprising:
    a main conversion circuit to convert input power for output, the main conversion circuit including the semiconductor device according to claim 1; and
    a control circuit to output, to the main conversion circuit, a control signal to control t he main conversion circuit.

* * * * *